United States Patent
Hoang et al.

(10) Patent No.: US 9,847,893 B2
(45) Date of Patent: Dec. 19, 2017

(54) DIGITAL EQUALIZER ADAPTATION USING ON-DIE INSTRUMENT

(71) Applicant: Altera Corporation, San Jose, CA (US)

(72) Inventors: Tim Tri Hoang, San Jose, CA (US); Nam V. Nguyen, San Jose, CA (US)

(73) Assignee: ALTERA CORPORATION, San Jose, CA (US)

( * ) Notice: Subject to any disclaimer, the term of this patent is extended or adjusted under 35 U.S.C. 154(b) by 0 days.

(21) Appl. No.: 15/483,881

(22) Filed: Apr. 10, 2017

(65) Prior Publication Data

US 2017/0214557 A1    Jul. 27, 2017

Related U.S. Application Data

(60) Division of application No. 15/194,325, filed on Jun. 27, 2016, now Pat. No. 9,628,304, which is a continuation of application No. 14/676,707, filed on Apr. 1, 2015, now Pat. No. 9,379,682, which is a continuation of application No. 13/974,297, filed on Aug. 23, 2013, now Pat. No. 9,001,943.

(60) Provisional application No. 61/782,855, filed on Mar. 14, 2013.

(51) Int. Cl.
| | |
|---|---|
| *H04L 25/03* | (2006.01) |
| *H03G 3/00* | (2006.01) |
| *H04B 1/16* | (2006.01) |
| *H04B 3/14* | (2006.01) |
| *H04L 5/00* | (2006.01) |

(52) U.S. Cl.
CPC ....... *H04L 25/03885* (2013.01); *H03G 3/002* (2013.01); *H04B 1/16* (2013.01); *H04B 3/143* (2013.01); *H04L 25/03* (2013.01); *H04L 25/03019* (2013.01); *H04L 25/03057* (2013.01); *H04L 5/006* (2013.01)

(58) Field of Classification Search
CPC .......... H04L 27/3809; H04L 25/03885; H04L 25/03057; H04L 25/03; H04L 25/03019; H03G 3/002; H03G 3/00; H04B 1/16
See application file for complete search history.

(56) References Cited

U.S. PATENT DOCUMENTS

| | | |
|---|---|---|
| 7,254,345 B2 | 8/2007 | Suzaki et al. |
| 2002/0163960 A1 | 11/2002 | Blodgett et al. |
| 2005/0047500 A1 | 3/2005 | Gupta et al. |
| 2007/0047680 A1 | 3/2007 | Okamura |
| 2007/0147555 A1 | 6/2007 | Mobin et al. |
| 2008/0005629 A1 | 1/2008 | Windler et al. |
| 2008/0019435 A1 | 1/2008 | Chou |

(Continued)

*Primary Examiner* — Jean B Corrielus
(74) *Attorney, Agent, or Firm* — Fletcher Yoder, P.C.

(57) ABSTRACT

Systems and methods are provided for adjusting gain of a receiver. Adaptation circuitry is operable to identify, based on a matrix representation of a receiver's output generated from horizontal and vertical sweeps of the receiver's output, an eye opening of the receiver's output. The adaptation circuitry is also operable to determine whether a size of the eye opening needs to be changed. When it is determined that the size of the eye opening needs to be changed, the adaptation circuitry is operable to generate a digital signal to change a gain setting of the receiver. When the signal at the receiver's output is under-equalized, the AC gain of the receiver is increased. When the signal at the receiver's output is over-equalized, the AC gain of the receiver is decreased.

20 Claims, 9 Drawing Sheets

(56) References Cited

U.S. PATENT DOCUMENTS

| | | |
|---|---|---|
| 2008/0027452 A1 | 1/2008 | Sheffer et al. |
| 2008/0247452 A1 | 10/2008 | Lee |
| 2010/0086017 A1 | 4/2010 | Shumarayev et al. |
| 2010/0128828 A1 | 5/2010 | Mobin et al. |
| 2010/0172400 A1 | 7/2010 | Chou |
| 2010/0290515 A1 | 11/2010 | Dai et al. |
| 2010/0303143 A1 | 12/2010 | Takeda |
| 2011/0187400 A1 | 8/2011 | Watanabe |
| 2011/0311009 A1 | 12/2011 | Flynn et al. |
| 2012/0170621 A1 | 7/2012 | Tracy et al. |

DIGITAL EQUALIZER ADAPTATION USING ON-DIE INSTRUMENT

CROSS REFERENCE TO RELATED APPLICATIONS

This is a division of U.S. patent application Ser. No. 15/194,325 (now U.S. Pat. No. 9,628,304, which issued on Apr. 18, 2017), filed on Jun. 27, 2016, which is a continuation of U.S. patent application Ser. No. 14/676,707, filed on Apr. 1, 2015 (now U.S. Pat. No. 9,379,682, which issued on Jun. 28, 2016); which is a continuation of U.S. patent application Ser. No. 13/974,297, filed on Aug. 23, 2013 (now U.S. Pat. No. 9,001,943, which issued on Apr. 7, 2015); which claims the benefit of, and priority to, U.S. Provisional Application No. 61/782,855, filed Mar. 14, 2013, the disclosure of each of which is hereby incorporated by reference herein in its entirety.

FIELD OF THE DISCLOSURE

This disclosure relates to systems and methods for adjusting the gain of a receiver in a communications system having digital adaption circuitry and an on-die instrument (ODI).

BACKGROUND OF THE DISCLOSURE

As data rates increase in a backplane, transmitted signals are subject to attenuation, reflections, and coupling. Data rates are often so fast that a transmitted signal may reach the bandwidth limitations of the transmission medium (e.g., wire), resulting in channel loss and degradation of the signal's eye opening by the time the signal reaches a receiver.

A receiver performs the dual functions of receiving an input signal and "boosting" the signal up (i.e., increasing the size of the eye opening) so that data can be recovered (e.g., by a sense amplifier or latch). A receiver may provide both DC gain and AC gain to the input signal. Increasing DC gain boosts all frequency components up to the Nyquist frequency (i.e., half of the data rate), including crosstalk and noise. Increasing AC gain of the received input signal boosts a particular frequency component, such as the frequency of the data rate, which may have been attenuated when it was transmitted in the transmission medium, due to channel loss. The greater the channel loss, the more AC gain a receiver may have to supply to the input signal, to compensate for the loss. If a receiver does not supply enough AC gain, the size of the input signal's eye opening may be too small for data to be accurately recovered, resulting in a high bit error rate (BER). However, if the AC gain level is too high, the input signal may be over-equalized, which may also result in a high BER. Thus, it is important to find and set the correct AC and DC gains for any given backplane to achieve a sufficiently low BER.

Analog adaptation capabilities for finding suitable AC and DC gains for a transceiver are well known. However, analog adaptation circuitry may be susceptible to process variations and component mismatches, and may not be easily migrated to a new process. In addition, analog adaptation is costly, requires a large silicon area, and consumes a lot of power.

SUMMARY OF THE DISCLOSURE

In light of the above, the present disclosure relates to systems and methods for a digital adaptation block ("digital block") in a communications system. Digital blocks may be easily migrated to any process node, and may also consume less power and take up less die area than their analog counterparts. In addition, digital blocks may be scalable for different processes and may not need to be optimized for analog components.

In accordance with embodiments of the present disclosure, adaptation circuitry is provided that is operable to identify, based on a matrix representation of a receiver's output generated from horizontal and vertical sweeps of the receiver's output, an eye opening of the receiver's output. Elements of the generated matrix representation may have a first value where an eye opening exists and a second value where an eye opening does not exist. The adaptation circuitry may be operable to control the horizontal and the vertical sweeps of the receiver's output, and to find envelope limits of the receiver's output. The adaptation circuitry is also operable to determine whether a size of the eye opening needs to be changed. When it is determined that the size of the eye opening needs to be changed, the adaptation circuitry is operable to generate a digital signal to change a gain setting of the receiver.

In accordance with additional embodiments of the present disclosure, the adaptation circuitry is further operable to calculate a vertical height of the identified eye opening and compare the calculated vertical height to a pre-defined vertical envelope or to an optimum vertical eye opening.

In accordance with additional embodiments of the present disclosure, the adaptation circuitry is further operable to determine whether the receiver's output is under-equalized or over-equalized. When it is determined that the receiver's output is under-equalized, the adaptation circuitry is operable to generate a digital signal to increase AC gain of the receiver if the AC gain of the receiver is not at a maximum setting. If the AC gain of the receiver is at the maximum setting, the adaptation circuitry is operable to generate a digital signal to decrease DC gain of the receiver and set the AC gain of the receiver substantially equal to zero. When it is determined that the receiver's output is over-equalized, the adaptation circuitry is operable to generate a digital signal to decrease the AC gain of the receiver if the AC gain of the receiver is not at a minimum setting. If the AC gain of the receiver is at the minimum setting, the adaptation circuitry is operable to generate a digital signal to increase the DC gain of the receiver and set the AC gain of the receiver substantially equal to zero. Methods corresponding to the above-mentioned systems are also provided.

In accordance with additional embodiments of the present disclosure, there is provided a communications system that includes a receiver having at least one amplifier, and an on-die instrument (ODI) configured to sample an output of the receiver. The communications system also includes a first digital adaptation unit configured to analyze outputs of the ODI, control horizontal and vertical sweeps of the receiver's output that are used to generate a matrix representation of the receiver's output, and generate a first set of digital signals for adjusting a gain setting of at least one amplifier in the receiver.

In accordance with additional embodiments of the present disclosure, the communications system further includes a decision feedback equalizer (DFE) configured to amplify the output of the receiver, and a clock-data recovery (CDR) unit coupled to an output of the DFE and configured to send data to the ODI. The communications system may have circuitry for bypassing the DFE such that the CDR unit is coupled to the output of the receiver. The communications system may also include a second digital adaptation unit configured to generate a second set of digital signals for adjusting a gain setting of the DFE.

In accordance with additional embodiments of the present disclosure, the communications system may also include a digital-to-analog converter configured to generate, based on the first set of digital signals, a bias signal that sets the gain setting of at least one amplifier in the receiver. The receiver may have a plurality of amplifiers. The digital-to-analog converter may generate, based on the first set of digital signals, a first plurality of bias signals for setting AC gains of the plurality of amplifiers. The digital-to-analog converter may also generate, based on the first set of digital signals, a second plurality of bias signals for setting DC gains of the plurality of amplifiers.

BRIEF DESCRIPTION OF THE FIGURES

Further features of the disclosure, its nature and various advantages will be apparent upon consideration of the following detailed description, taken in conjunction with the accompanying drawings, in which like referenced characters refer to like parts throughout, and in which.

DETAILED DESCRIPTION

To provide an overall understanding of the invention, certain illustrative embodiments will now be described. However, it will be understood by one of ordinary skill in the art that the systems and methods described herein may be adapted and modified as is appropriate for the application being addressed and that the systems and methods described herein may be employed in other suitable applications, and that such other additions and modifications will not depart from the scope hereof.

The figures described herein show illustrative embodiments; however, the figures may not necessarily not show and may not be intended to show the exact layout of the hardware components contained in the embodiments. The figures are provided merely to illustrate the high level conceptual layouts of the embodiments. The embodiments disclosed herein may be implemented with any suitable number of components and any suitable layout of components in accordance with principles known in the art.

Figure 1:
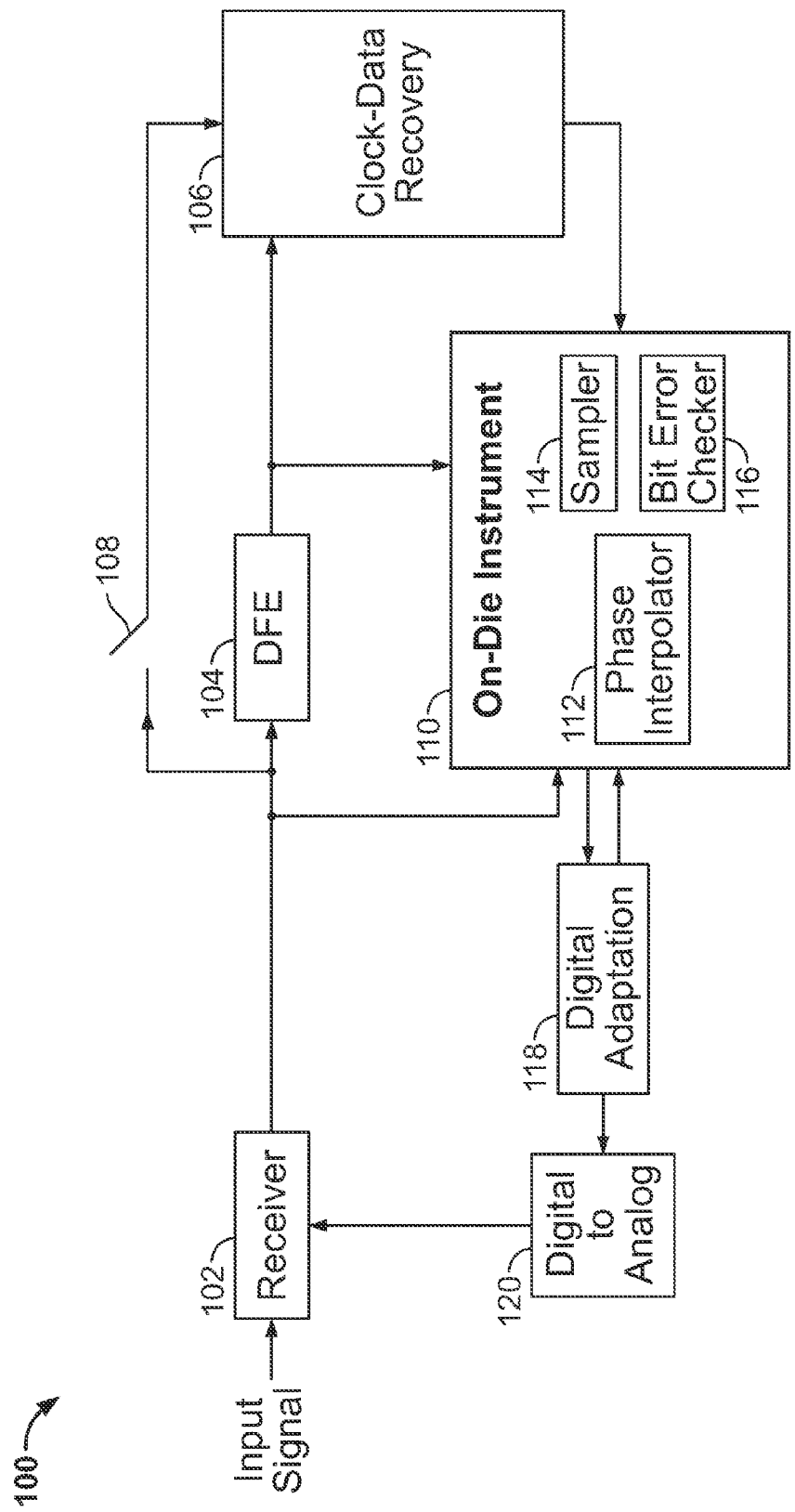
FIG. 1 is a block diagram of a communications system having an adjustable gain receiver, according to an illustrative embodiment.

FIG. 1 shows an illustrative block diagram of a communications system 100 having an adjustable gain receiver 102, according to an illustrative embodiment. Receiver 102 receives and amplifies an input signal. Although receiver 102 in FIG. 1 is shown to receive a single input signal, it should be understood that receiver 102 may receive any number of input signals, such as a differential input signal. In some embodiments, receiver 102 may have multiple amplifier stages, as discussed below with respect to FIG. 3. The AC and DC gain of each stage of receiver 102 may be adjusted by digital signals received from digital to analog block 120.

The output of receiver 102 is passed to decision feedback equalizer (DFE) 104, which filters the input signal and provides additional gain. In some embodiments, DFE 104 may be part of receiver 102. In some embodiments, DFE 104 may have only passive components. In some embodiments, DFE 104 may have active components. The output of DFE 104 is passed to clock-data recovery (CDR) block 106. In some embodiments, the additional gain of DFE 104 may not be needed, and switch 108 may be used to bypass DFE 104 such that the output of receiver 102 is passed directly to clock-data recovery (CDR) block 106.

CDR block 106 recovers and samples a clock from the incoming data stream. CDR block 106 may include a sense amplifier, phase detector, charge pump, and voltage-controlled oscillator (VCO). The output of CDR block 106 is passed to on-die instrument (ODI) 110, which may use data from CDR block 106 to analyze the output of DFE 104 or, if DFE 104 is bypassed, the output of receiver 102. It should be understood that the output of receiver 102 is analyzed when DFE 104 is bypassed, and that the output of DFE 104 is analyzed when DFE 104 is not bypassed. It should be understood that all discussions herein of the analysis of the output of a receiver (e.g., receiver 102) are applicable to the analysis of the output of a DFE (e.g., DFE 104).

ODI 110 may analyze the output of receiver 102 by generating a matrix representation of the receiver's output, and measuring the eye opening of the receiver's output based on the generated matrix representation. ODI 110 may include a phase interpolator 112, sampler 114, and bit error checker 116, all of which may be used to generate a matrix representation of the output of receiver 102. Phase interpolator 112 may scan the phase of the output of receiver 102 to perform a horizontal sweep of the receiver's output. The time between phase steps may be determined by ODI counter delay control bits. The horizontal phase step data may be sampled by sampler 114 and sent to bit error checker 116 to perform a vertical sweep of the receiver's output. Where signal information is present, bit error checker 116 may output a first symbol (e.g., a logical '0') for a sample in an eye opening of the receiver's output, and may output a second symbol (e.g., a logical '1') otherwise. The matrix representation generated by ODI 110 thus resembles an eye diagram of the output of receiver 102, with, for example, 0's in the regions corresponding to eye openings and 1's everywhere else. The size of the matrix may be determined by the granularity of phase interpolator 112 and bit error checker 116. For example, if phase interpolator 112 scans 64 horizontal phase steps and bit error checker 116 is a 128-bit comparator, a 128×64 matrix will be created.

The matrix representation generated by ODI 110 may be analyzed by digital adaptation block 118 to determine whether the eye opening at the output of receiver 102 is suitable for accurate data recovery. In some embodiments, digital adaptation block 118 may calculate a vertical eye opening based on the generated matrix representation by, for example, calculating the number of consecutive rows that have logical 0's in the same column. Digital adaptation block 118 may determine, based on the generated matrix representation, whether the output is under-equalized, over-equalized, or properly equalized. Illustrative eye diagrams of under-equalized, over-equalized, and properly equalized signals are discussed further with respect to FIGS. 4A-C.

If digital adaptation block 118 determines that the output of receiver 102 is not properly equalized (e.g., under-equalized or over-equalized), digital adaptation block 118 generates a digital signal to change one or more gain settings of receiver 102. In some embodiments, the digital signal may be a bit string. The generated digital signal is passed to digital to analog block 120, which may generate, based on the digital signal, one or more bias signals that change one or more gain settings in receiver 102. The bias signals generated by digital to analog block 120 may change the AC gain or DC gain, or both, of receiver 102. An illustrative process for determining how the AC and/or DC gain of a receiver should be changed is discussed further with respect to FIG. 6. The change(s) in gain(s) will change the eye opening of the output of receiver 102 (and of the output of DFE 104, if not bypassed).

Digital adaptation block 118 may choose the best sampling point for the receiver's output and may control the horizontal and the vertical sweeps performed by ODI 110 to generate another matrix representation of the receiver's output. The gain settings of receiver 102 may be changed, and corresponding matrix representations of the receiver's output generated and analyzed, as part of an iterative process (e.g., the process discussed with respect to FIG. 6) until the eye opening of the output of receiver 102 is suitable for accurate data recovery.

Figure 2:
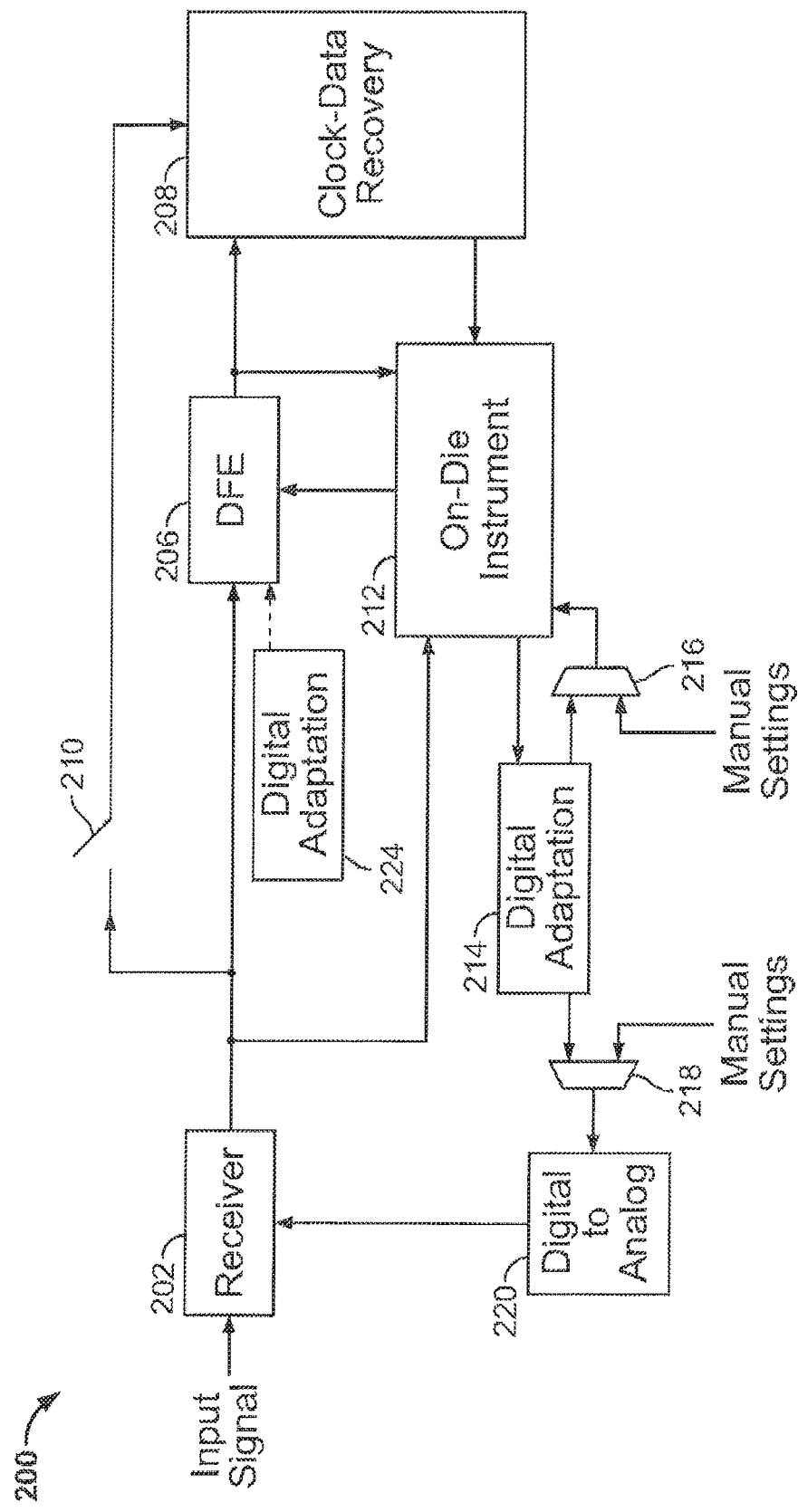
FIG. 2 is a block diagram of a communications system having an adjustable gain receiver and an adjustable gain DFE, according to an illustrative embodiment.

In some embodiments, the gain of DFE 104 may be adjustable. FIG. 2 shows an illustrative block diagram of a communications system 200 having an adjustable gain receiver 202 and an adjustable gain DFE 206, according to an illustrative embodiment. Receiver 202, switch 210, clock-data recovery (CDR) block 208, on-die instrument (ODI) 212, digital adaptation block 214, and digital to analog block 220 of FIG. 2 are analogous to receiver 102, switch 108, CDR block 106, ODI 110, digital adaptation block 118, and digital to analog block 120, respectively, of FIG. 1. It should be understood that the term "analogous" as used herein means similar in form and function. In some embodiments, at least some elements (e.g., digital adaptation blocks 118 and 214, ODIs 110 and 212) of communications systems 100 and/or 200 may be implemented on circuitry of an integrated circuit (IC) or programmable logic device (PLD).

In some embodiments (e.g., if gain provided by DFE 206 is not needed), DFE 206 may be bypassed by switch 210 such that the output of receiver 202 is passed directly to CDR block 208. In some embodiments, the gain of DFE 206 may be controlled by a digital adaptation block (not shown) that is analogous to but distinct from digital adaptation block 214, and which may include a digital to analog block similar to digital to analog block 220. In some embodiments, digital adaptation circuitry may be built into DFE 206.

Digital adaptation circuitry that controls the gain of DFE 206 may analyze data, such as a matrix representation of the output of DFE 206, from ODI 212 to determine whether the eye opening at the output of DFE 206 is suitable for accurate data recovery. The generation, contents, and analysis of a matrix representation of the output of DFE 206 may be analogous to those of a matrix representation of the output of receiver 102, as discussed above with respect to FIG. 1. Based on the analysis of a matrix representation of the DFE's output, digital adaptation circuitry that controls the gain of DFE 206 may generate one or more digital signals to change the AC gain, DC gain, or both of DFE 206 using, for example, a process similar to that discussed with respect to FIG. 6. Such digital adaptation circuitry may execute an iterative process analogous to that discussed with respect to FIG. 1 until the eye opening of the output of DFE 206 is suitable for accurate data recovery.

Communications system 200 includes multiplexer 216 and multiplexer 218, which each allow digital adaptation block 214 to be bypassed in favor of manual settings. Multiplexer 216 allows for selection between an output from digital adaptation block 214 and manual settings as an input to ODI 212. Selecting the manual settings using multiplexer 216 allows a user of system 200 to manually control the horizontal and vertical sweeps and other functions performed by ODI 212. Multiplexer 218 allows for selection between an output from digital adaptation block 214 and manual settings as an input to digital to analog block 220. Selecting the manual settings using multiplexer 218 allows a user of system 200 to manually set the AC and DC gains of receiver 202. In embodiments where the gain of DFE 206 is controlled by a separate digital adaptation block, a multiplexer (not shown) may be placed between the digital adaptation block and DFE 206 to allow the digital adaptation block to be bypassed in favor of manual settings.

A user of system 200 may select between a digital adaptation block and manual settings by setting a bypass configuration bit. In some embodiments, the manual settings may be read from a memory (not shown) that is part of system 200. In some embodiments, system 200 may receive the manual settings from a user or from circuitry external to system 200 via I/O circuitry (e.g., I/O circuitry 950 of FIG. 9).

Figure 3:
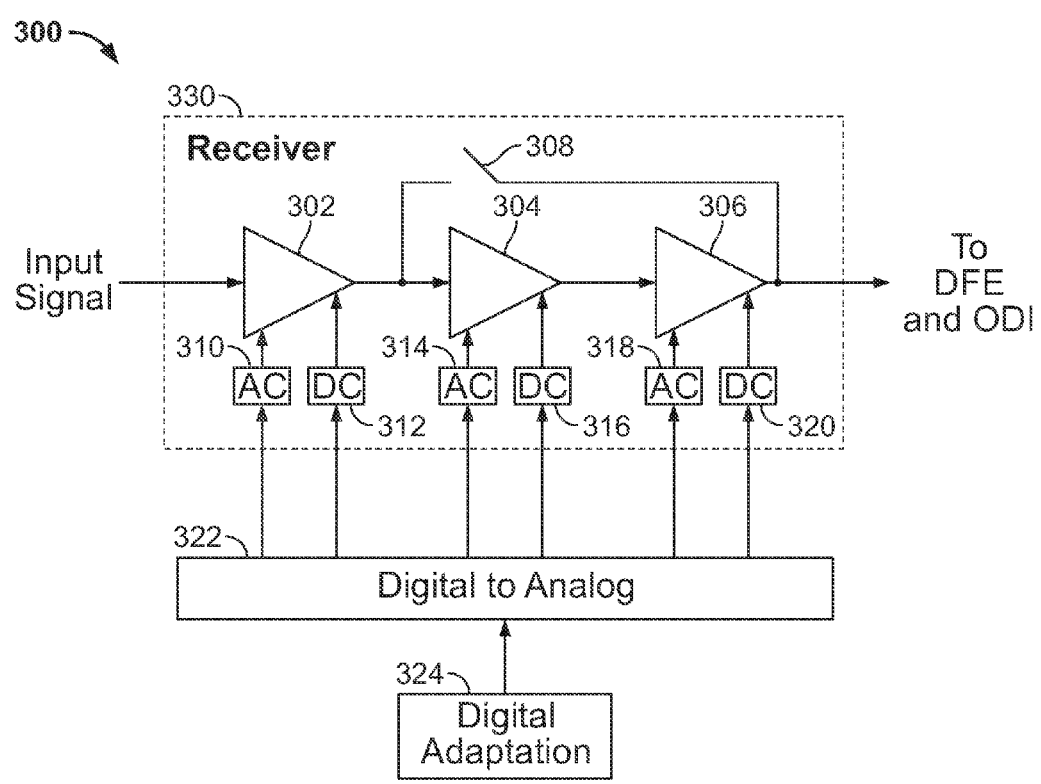
FIG. 3 is a block diagram of a communications system having a multistage amplifier as a receiver, according to an illustrative embodiment.

In some embodiments, receiver 202 of FIG. 2, or receiver 102 of FIG. 1, may have more than one amplifier with adjustable gain. FIG. 3 shows an illustrative block diagram of a communications system 300 having a multistage amplifier as a receiver, according to an illustrative embodiment. In some embodiments, communications system 300 may be implemented as part of communications system 100 of FIG. 1, where digital to analog block 322 and digital adaptation block 324 of FIG. 3 are analogous to digital to analog block 120 and digital adaptation block 118, respectively, of FIG. 1, and the dotted box labeled "Receiver" 330 (referred to herein as "receiver 330") of FIG. 3 is a more detailed illustration of receiver 102 of FIG. 1. In some embodiments, communications system 300 may be implemented as part of communications system 200 of FIG. 2, where digital to analog block 322 and digital adaptation block 324 of FIG. 3 are analogous to digital to analog block 220 and digital adaptation block 214, respectively, of FIG. 2, and receiver 330 of FIG. 3 is a more detailed illustration of receiver 202 of FIG. 2.

Receiver 330 of FIG. 3 includes a first amplifier 302, a second amplifier 304, and a third amplifier 306, each with adjustable AC and DC gain controls. In some embodiments, second amplifier 304 and third amplifier 306 may be bypassed by closing switch 308. The AC gain level of first amplifier 302 may be set by AC gain control 310, and the DC gain level of first amplifier 302 may be set by DC gain control 312. The AC gain level of second amplifier 304 may be set by AC gain control 314, and the DC gain level of second amplifier 304 may be set by DC gain control 316. The AC gain level of third amplifier 306 may be set by AC gain control 318, and the DC gain level of third amplifier 306 may be set by DC gain control 320. AC gain controls 310, 314, and 318 and DC gain controls 312, 316, and 320 may receive bias signals from digital to analog block 322, which in turn may receive digital signals for gain adjustment from digital adaptation block 324.

In some embodiments, the digital signals for gain adjustment may be in the form of a bit string. In some embodiments, the output of digital adaptation block 324 may be a 6-bit string, which allows for 64 steps of gain. Each step may correspond to, for example, a 15-mV change in the receiver's overall gain, which may be effected by one of amplifiers 302, 304, and 306. In some embodiments, gain increments may be spread among amplifiers 302, 304, and 306 such that the gain of first amplifier 302 is greater than or equal to that of second amplifier 304, and the gain of second amplifier 304 is greater than or equal to that of third amplifier 306. The order in which AC and DC gain are increased among amplifiers 302, 304, and 306 may be determined using gain configuration bits.

The AC and DC gain levels of a receiver, such as receiver 102 of FIG. 1, receiver 202 of FIG. 2, or receiver 330 of FIG. 3, may be set based on the size of the eye opening of the receiver's output, as represented in an eye diagram. The eye diagram of the receiver's output may change as the AC and DC gains change. Ideally, an eye diagram has an eye opening that is wide both horizontally and vertically, with no overshoots and undershoots of the signal envelope. The ideal place to sample a signal is in the center (both horizontally and vertically) of the eye opening.

Figure 4A:
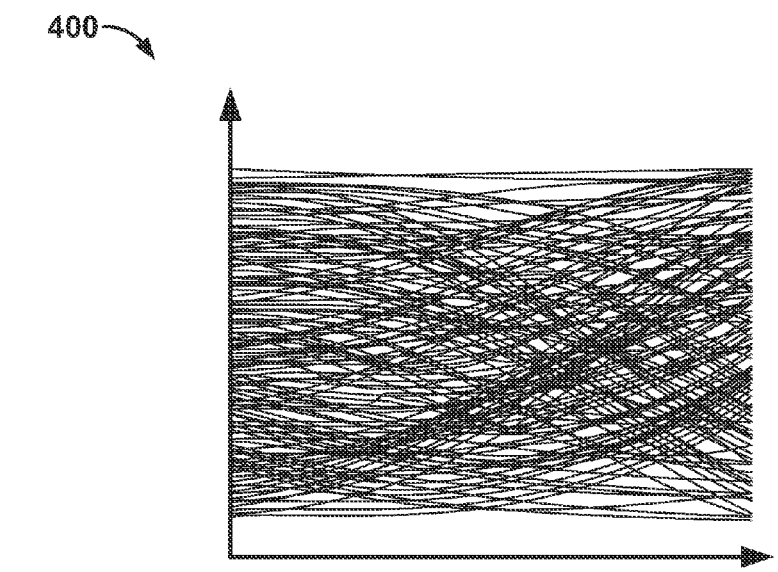
FIG. 4A shows an eye diagram of an under-equalized signal, according to an illustrative embodiment.
Figure 4B:
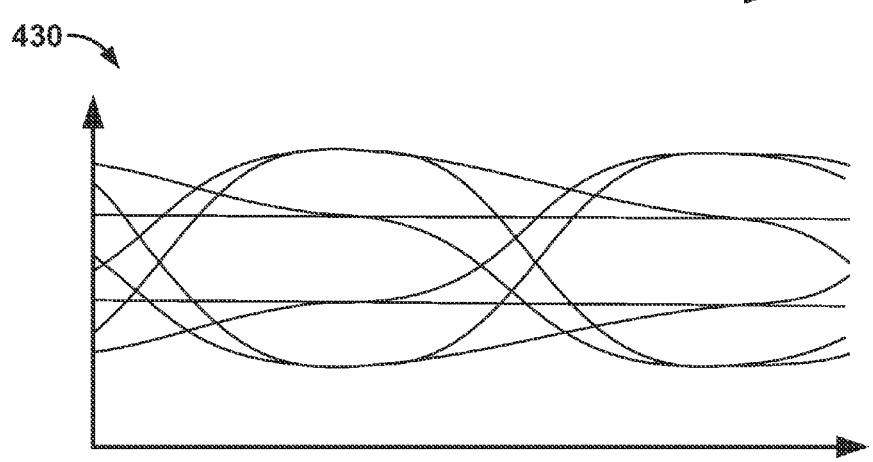
FIG. 4B shows an eye diagram of an over-equalized signal, according to an illustrative embodiment.
Figure 4C:
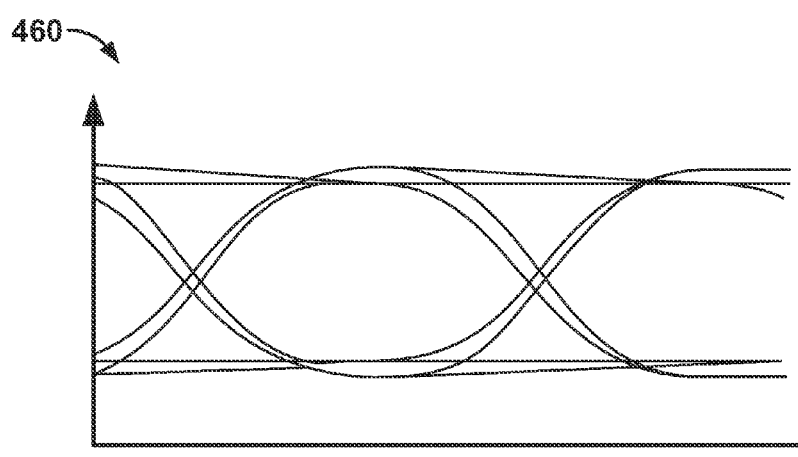
FIG. 4C shows an eye diagram of a properly equalized signal, according to an illustrative embodiment.

FIGS. 4A-C show illustrative eye diagrams of a signal at a receiver's output. In FIGS. 4A-C, the vertical axes measure the amplitude (e.g., in units of voltage or power) of the signal, and the horizontal axes measure time passed.

FIG. 4A shows an illustrative eye diagram 400 of an under-equalized signal, according to an illustrative embodiment. In the eye diagram of an under-equalized signal, such as eye diagram 400, there is no distinguishable eye opening within the envelope of the signal. The absence of an eye opening, or a very small eye opening, indicates severe distortion of the signal waveform, which may be caused by inter-symbol interference and channel noise.

FIG. 4B shows an illustrative eye diagram 430 of an over-equalized signal, according to an illustrative embodiment. The eye diagram of an over-equalized signal, such as eye diagram 430, is characterized by overshooting and undershooting of the signal envelope. In eye diagram 430, the signal envelope can be seen as two parallel horizontal lines. The local minima and local maxima of the signal prominently fall below and exceed, respectively, the envelope. The overshooting and undershooting may be caused by interruptions in the signal path.

FIG. 4C shows an illustrative eye diagram 460 of a properly equalized signal, according to an illustrative embodiment. In eye diagram 460, the eye opening is wide both horizontally and vertically, and there are no significant overshoots or undershoots of the signal envelope. An eye diagram similar to eye diagram 460 indicates that data can be accurately recovered by the receiver.

Figure 5:
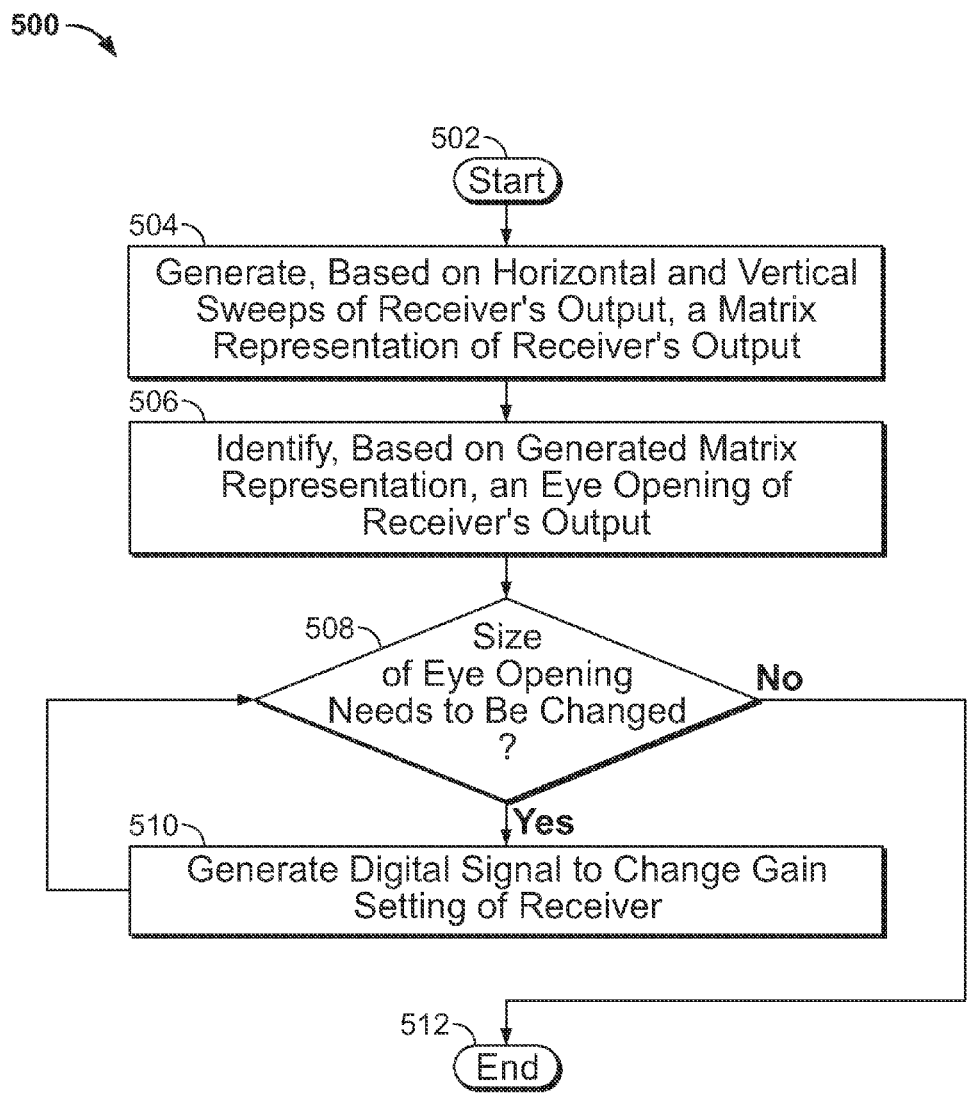
FIG. 5 shows an illustrative flow diagram of a process for adjusting the gain of a receiver, according to an illustrative embodiment.
Figure 6:
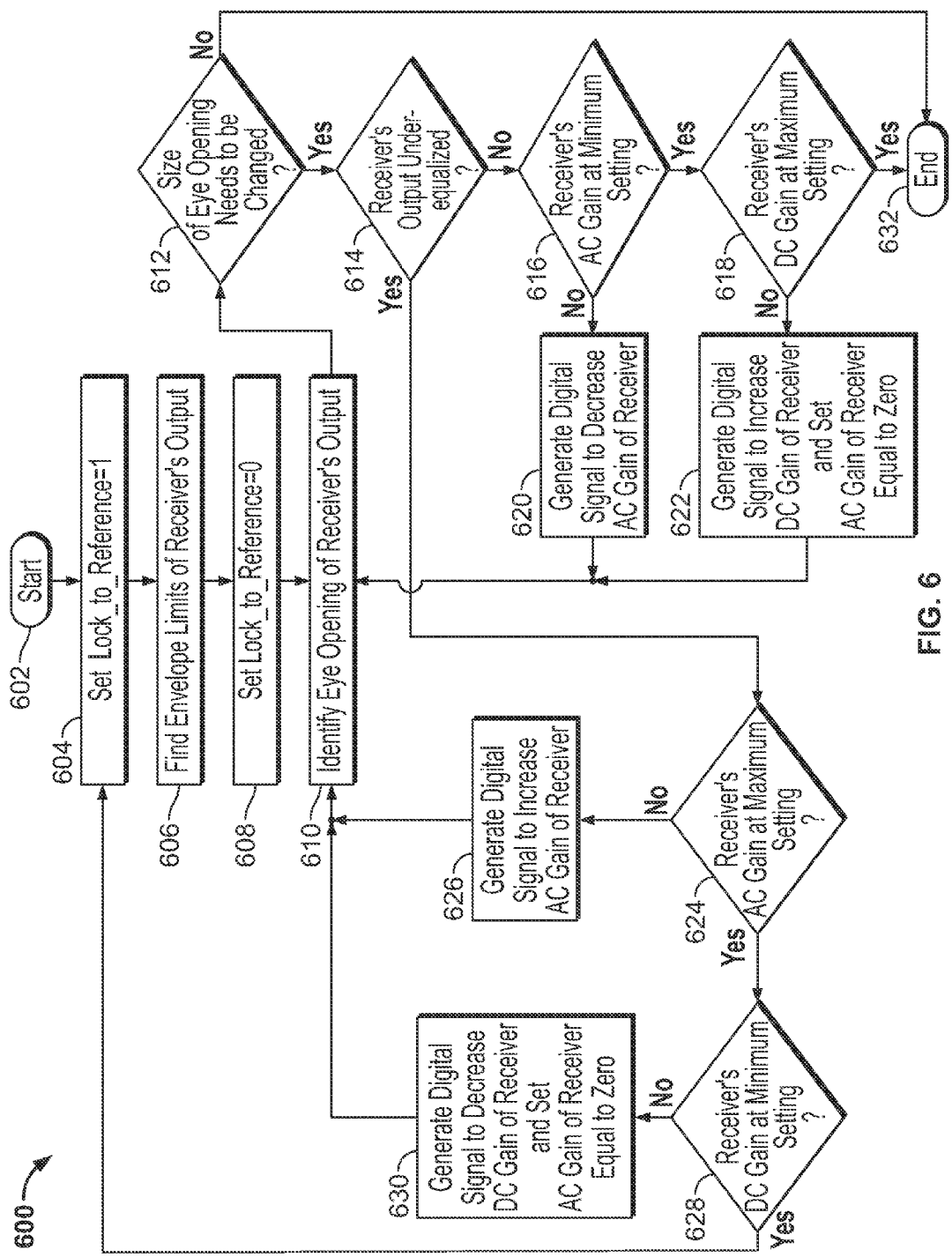
FIG. 6 shows an illustrative flow diagram of a process for determining how to adjust the AC and/or DC gain of a receiver, according to an illustrative embodiment.

To obtain an eye diagram like eye diagram 460, the AC and DC gain levels of a receiver must be properly set. FIGS. 5-6 show illustrative processes for adjusting the gain of a receiver. Although the discussions herein with respect to FIGS. 5-6 relate to analyzing an output of a receiver and adjusting gain settings of the receiver, it should be understood that the processes of FIGS. 5-6 may also be applied to analyzing an output of a DFE and adjusting gain settings of the DFE.

FIG. 5 shows an illustrative process 500 for adjusting the gain of a receiver, according to an illustrative embodiment. The elements of process 500 may be carried out by circuitry of an integrated circuit device, as discussed below with respect to FIG. 9. Process 500 starts at 502, and at 504, a matrix representation of the receiver's output may be generated based on horizontal and vertical sweeps of the receiver's output. The matrix representation may be generated by an ODI, such as ODI 110, as discussed above with respect to FIG. 1.

At 506, an eye opening of the receiver's output may be identified based on the generated matrix representation at 504. As discussed above with respect to FIG. 1, an eye opening may be identified as a cluster of 0's in the matrix representation generated by the ODI. A vertical height of the identified eye opening may be calculated based on the generated matrix representation.

At 508, it may be determined whether the size of the eye opening identified at 506 needs to be changed. A process for making such a determination is discussed further with respect to FIG. 6. In general, the size of the eye opening may need to be changed if the signal at the receiver's output is under-equalized (as illustrated above in FIG. 4A) or over-equalized (as illustrated above in FIG. 4B). The size of the eye opening may not need to be changed if the signal at the receiver's output is properly equalized (as illustrated above in FIG. 4C). A process for determining whether a signal is under-equalized or over-equalized is discussed further with respect to FIG. 8.

If, at 508, it is determined that the size of the eye opening needs to be changed, process 500 proceeds to 510. At 510, a digital signal may be generated to change a gain setting of the receiver. In general, if the signal at the receiver's output is under-equalized, the AC gain of the receiver should be increased, or if the AC gain is already at the maximum level, the DC gain should be decreased, and the AC gain set equal to its minimum level (e.g., substantially zero) to be swept again. If the signal at the receiver's output is over-equalized, the AC gain of the receiver should be decreased, or if the AC gain is already at the minimum level, the DC gain should be increased, and the AC gain set equal to its minimum level (e.g., substantially zero) to be swept again.

In some embodiments, the AC gain may be set equal to its maximum level, rather than its minimum level, to be swept again after the DC gain is increased or decreased. Whether the AC gain is swept from minimum to maximum, or from maximum to minimum, may depend on the value of an AC sweep control bit. The AC sweep control bit may be received from local circuitry used to implement process 500, or from external circuitry or a user via I/O circuitry.

After a digital signal to change a gain setting is generated at 510, process 500 may loop back to 508. In some embodiments, after each change in AC gain, a time period set by one or more gain counter delay control bits may be allowed to pass before the size of the eye opening is analyzed again at 508.

If, at 508, it is determined that the size of the eye opening identified at 506 does not need to be changed, process 500 ends at 512. A determination that the size of the eye opening does not need to be changed may indicate that the signal at the receiver's output is properly equalized and that data can be accurately recovered using the current gain settings of the receiver.

FIG. 6 shows an illustrative process 600 for determining how to adjust the AC and/or DC gain of a receiver, according to an illustrative embodiment. Process 600 includes elements for identifying an eye opening of a receiver's output and determining whether the size of the eye opening needs to be changed in order for data to be accurately recovered. If, during process 600, it is determined that the size of the eye opening needs to be changed, digital signals are generated to adjust the AC and/or DC gains of the receiver.

Process 600 may be performed by a communications system, such as communications system 100 or communications system 200, that includes a receiver, a CDR block, an ODI, and a digital adaptation block. In some embodiments, process 600 may be performed once for a received input signal. In some embodiments, process 600 may be performed continuously as long as an input signal is being received. A user of a communications system may select between one-time and continuous adaptation by setting an adaptation configuration bit. If one-time adaptation is selected, the digital adaptation block may be put in standby mode at the conclusion of process 600 until a reset signal is received. In some embodiments, a digital adaptation block may be reset by setting an adaptation restart bit.

The elements of process 600 may be carried out by circuitry of an integrated circuit device, as discussed below with respect to FIG. 9. Process 600 starts at 602, and at 604, the lock_to_reference bit of the CDR block is set to a first value (e.g., 1) so that the envelope limits of the eye diagram of the receiver's output may be determined. When the lock_to_reference bit is set to, for example, 1, the CDR block may lock onto a reference frequency and may ignore phase information in the received data. At 606, the envelope limits of the receiver's output are found. The envelope limits may be found using a process similar to process 700, which is discussed below with respect to FIG. 7.

The envelope limits of an eye diagram delineate the maximum size of the eye opening without attenuation. Because high (e.g., AC) frequencies experience more channel loss than low (e.g., DC) frequencies, the AC and DC gain levels at 604 and 606 may be set based on what types of components are in a DFE in the system performing process 600. In some embodiments, process 600 may be performed by a communications system having a DFE with all passive components. To reduce peaking in such embodiments, the DC gain of the receiver may be set to the maximum level and the AC gain set to the minimum level while elements 604 and 606 are performed. For embodiments where process 600 is performed by a communications system having a DFE with active components, the DC gain may be set to the minimum level while elements 604 and 606 are performed because the active components can be turned off.

After the envelope limits are found at 606, process 600 proceeds to 608, at which the lock_to_reference bit of the CDR block may be set to a second value (e.g., 0). When the lock_to_reference bit is set to, for example, 0, the CDR block may process the received signal, including its phase information. The ODI and digital adaptation block may then identify and analyze an eye opening within the envelope limits.

It should be understood that the value of the lock_to_reference bit for which the CDR block ignores the received signal may depend on the user implementation. For example, in some embodiments, the CDR block may ignore the received signal when the lock_to_reference bit is set to a second value (e.g., 0) and process the received signal when the lock_to_reference bit is set to a first value (e.g., 1).

At 610, an eye opening of the receiver's output may be identified. An eye opening may be identified, for example, based on a generated matrix representation of the receiver's output, as discussed above with respect to FIG. 1. In particular, an eye opening may be represented as a cluster of a first symbol (e.g., 0's) in the matrix representation generated by the ODI. A vertical height of the identified eye opening may be calculated based on the generated matrix representation.

At 612, it may be determined whether the size of the eye opening identified at 610 needs to be changed. In some embodiments, the vertical height of the identified eye opening may be compared to a pre-defined vertical envelope, in which case the size of the identified eye opening may need to be changed if its vertical height significantly overshoots or undershoots the pre-defined vertical envelope by more than some predetermined threshold value.

In some embodiments, the vertical height of the eye opening may be compared to an optimum vertical eye opening, which is determined by the value to which the matrix representation, generated based on the output of the bit error checker of the ODI, converges. In such embodiments, the size of the identified eye opening may need to be changed if its vertical height differs from the optimum vertical eye opening by more than some predetermined threshold value. A user may select between comparison to a pre-defined vertical envelope and comparison to an optimum vertical eye opening by setting a configuration bit. In some embodiments, control bits for an adaptation convergence counter filter may be used to set how long a digital adaptation block waits before determining that the vertical height of the eye opening matches that of a predetermined or optimum eye opening. The control bits may be received from local circuitry used to implement process 600, or from external circuitry or a user via I/O circuitry.

If, at 612, it is determined that the size of the eye opening identified at 610 does not need to be changed, process 600 ends at 632. A determination that the size of the eye opening does not need to be changed may indicate that the signal at the receiver's output is properly equalized and that data can be accurately recovered using the current gain settings of the receiver. A determination that the size of the eye opening does need to be changed may indicate that the signal at the receiver's output is either under-equalized or over-equalized. A process for determining whether a signal is under-equalized or over-equalized is discussed further with respect to FIG. 8.

If, at 612, it is determined that the size of the eye opening does need to be changed, process 600 proceeds to 614. At 614, it may be determined whether the receiver's output is under-equalized. If so, process 600 proceeds to 624, at which it may be determined whether the AC gain of the receiver is at the maximum setting. If, at 624, it is determined that the AC gain of the receiver is not at the maximum setting, process 600 proceeds to 626, at which a digital signal may be generated to increase the AC gain of the receiver. Increasing the AC gain of the receiver may have the effect of increasing the size of the eye opening. The digital signal to increase AC gain may be generated, for example, by digital adaptation block 118 or digital adaptation block 214. The digital signal generated at 626 may be used by a digital to analog block, such as digital to analog block 120 or digital to analog block 220, to generate a bias signal that increases the AC gain of the receiver. Process 600 then proceeds to 610.

If, at 624, it is determined that the AC gain of the receiver is at the maximum setting, process 600 proceeds to 628. At 628, it may be determined whether the DC gain of the receiver is at the minimum setting. If so, it may not be possible to further improve the receiver's eye opening, even though the eye opening is not suitable for accurate data recovery, and process 600 loops back to 604 to start over. If, at 628, it is determined that the DC gain of the receiver is not at the minimum setting, process 600 proceeds to 630.

At 630, a digital signal may be generated to decrease the DC gain of the receiver and set the AC gain of the receiver substantially equal to zero. Decreasing the DC gain of the receiver may allow for a greater range of AC gain. The digital signal generated at 630 may be generated, for example, by digital adaptation block 118 or digital adaptation block 214. The digital signal may be used by a digital to analog block, such as digital to analog block 120 or digital to analog block 220, to generate a bias signal that decreases the DC gain of the receiver and sets the AC gain substantially equal to zero. Process 600 may then loop back to 610.

If, at 614, it is determined that the receiver's output is not under-equalized, then the receiver's output is over-equalized (i.e., because it was determined at 612 that the size of the eye opening may need to be changed, the output may not be properly equalized, and if an improperly equalized output is not under-equalized then it may be over-equalized) and process 600 proceeds to 616.

At 616, it may be determined whether the AC gain of the receiver is at the minimum setting. If not, process 600 proceeds to 620, at which a digital signal may be generated to decrease the AC gain of the receiver. The digital signal may be generated, for example, by digital adaptation block 118 or digital adaptation block 214. The digital signal generated at 620 may be used by a digital to analog block, such as digital to analog block 120 or digital to analog block 220, to generate a bias signal that decreases the AC gain of the receiver. Process 600 may then loop back to 610.

If, at 616, it is determined that the AC gain of the receiver is at the minimum setting, process 600 proceeds to 618. At 618, it may be determined whether the DC gain of the receiver is at the maximum setting. If so, the over-equalized signal cannot be improved further and process 600 ends at 632. If, at 618, it is determined that the DC gain of the receiver is not at the maximum setting, process 600 proceeds to 622.

At 622, a digital signal may be generated to increase the DC gain of the receiver and set the AC gain of the receiver substantially equal to zero. The digital signal may be generated, for example, by digital adaptation block 118 or digital adaptation block 214. The digital signal generated at 622 may be used by a digital to analog block, such as digital to analog block 120 or digital to analog block 220, to generate a bias signal that increases the DC gain of the receiver and sets the AC gain substantially equal to zero. Process 600 may then loop back to 610.

In some embodiments, a process for finding the envelope of the eye diagram may be performed every time the DC gain is adjusted. In such embodiments, process 600 may loop back to 606 instead of 610 after element 622 or 630 is performed. A user may select whether to find the envelope every time the DC gain is adjusted, or only after the lock_to_reference bit is set to a particular value (e.g., 1), by setting a control bit.

Figure 7:
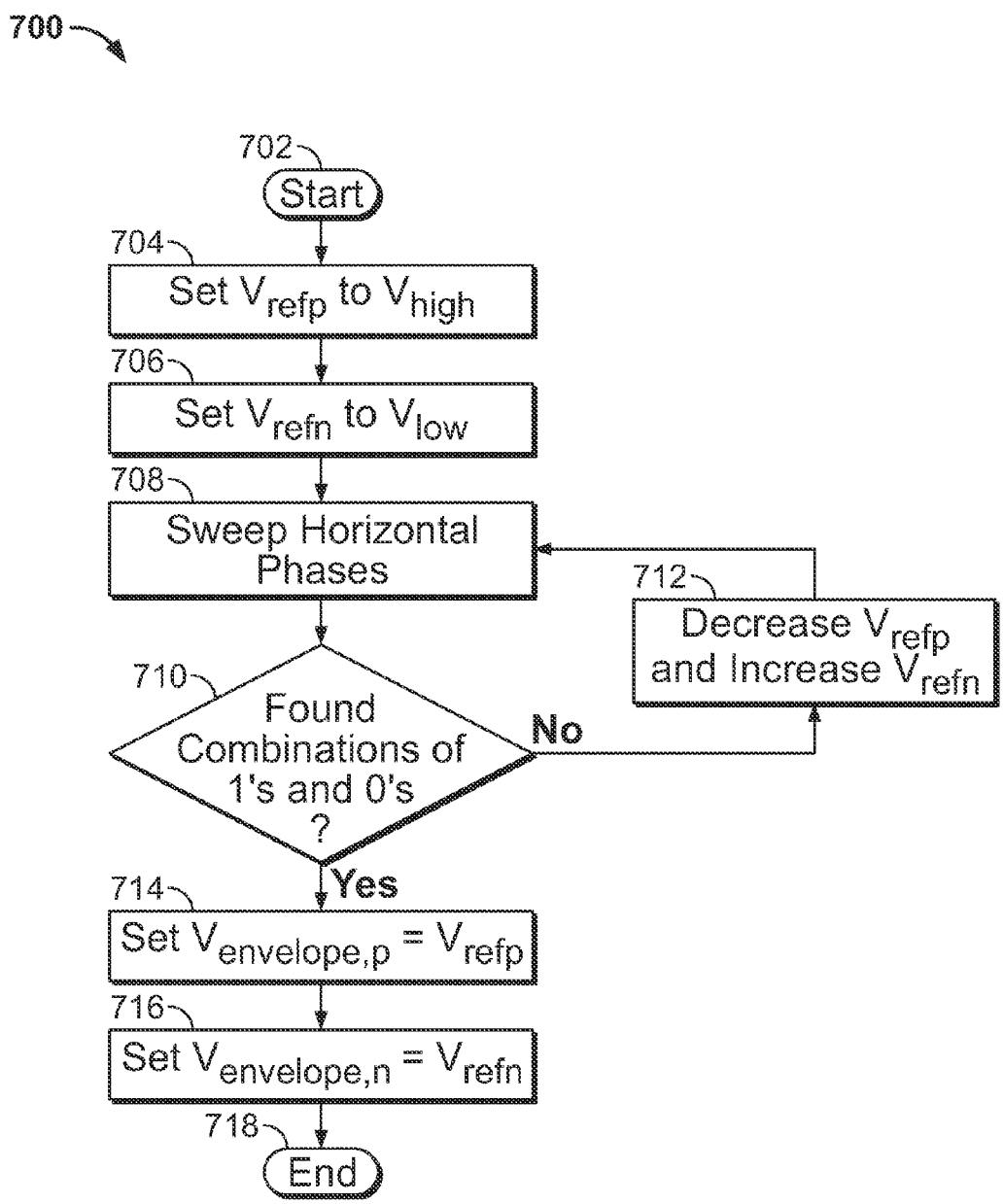
FIG. 7 shows an illustrative flow diagram of a process for finding the envelope of an eye diagram, according to an illustrative embodiment.

FIG. 7 shows an illustrative process 700 for finding the envelope of an eye diagram, according to an illustrative embodiment. During process 700, voltage markers Vrefp and Vrefn start at the level of the maximum and minimum voltage rails, respectively, and are brought closer together until the results of a horizontal phase sweep indicate that Vrefp and Vrefn mark the maximum and minimum voltages, respectively, of the envelope. The elements of process 700 may be carried out by circuitry of an integrated circuit device, as discussed below with respect to FIG. 9.

Process 700 may start at 702, and at 704, the Vrefp marker may be set to the level of the maximum voltage rail, Vhigh. At 706, the Vrefn marker may be set to the level of the minimum voltage rail, Vlow. At 708, horizontal phases of the receiver's output may be swept. The horizontal phases may be swept by, for example, ODI 110 or ODI 212 and be controlled by digital adaptation block 118 or digital adaptation block 214.

At 710, it may be determined whether combinations of symbols (e.g., logical 1's and 0's) have been found based on the sweep of 708. The determination of 710 may be made by examining the output of a bit error checker (e.g., comparator) whose input is data from the sweep at 708. In some embodiments, the determination of 710 may be based on whether the number of logical 1's and 0's exceeds a predetermined threshold. If, at 710, it is determined that combinations of symbols (e.g., logical 1's and 0's) have not been found, process 700 may proceed to 712, at which the Vrefp marker may be decreased and the Vrefn marker may be increased. The absence of combinations of symbols (e.g., logical 1's and 0's) may indicate that the envelope limits have not yet been found, so the Vrefp and the Vrefn markers may be moved closer together. Process 700 may then loop back to 708.

If, at 710, it is determined that combinations of symbols (e.g., logical 1's and 0's) have been found, the envelope limits have been found and process 700 may proceed to 714. At 714, the Venvelope,p marker may be set equal to the Vrefp marker. At 716, the Venvelope,n marker may be set equal to the Vrefn marker. Process 700 may then end at 718.

After process 700 or a similar process is used to find the envelope of an eye diagram of a receiver's output, an eye opening may be identified and analyzed. How the size of the eye opening needs to be changed may depend on whether the signal at the receiver's output is under-equalized or over-equalized.

Figure 8:
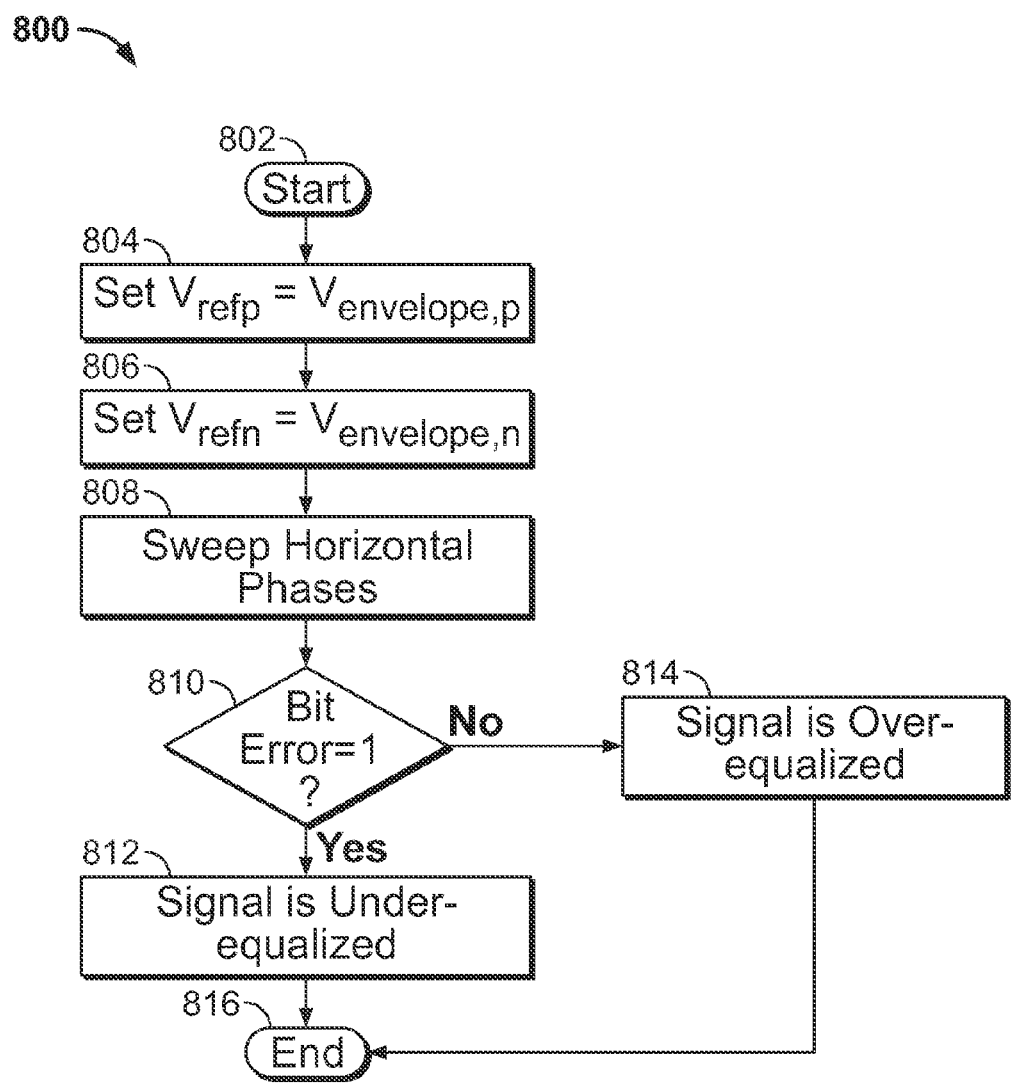
FIG. 8 shows an illustrative flow diagram of a process for determining whether a signal is under-equalized and/or over-equalized, according to an illustrative embodiment.

FIG. 8 shows an illustrative process 800 for determining whether a signal is under-equalized and/or over-equalized, according to an illustrative embodiment. Process 800 may be used during the determination of 614 discussed above with respect to FIG. 6. The elements of process 800 may be carried out by circuitry of an integrated circuit device, as discussed below with respect to FIG. 9.

Process 800 starts at 802, and at 804, the Vrefp marker may be set equal to the Venvelope,p marker. At 806, the Vrefn marker may be set equal to the Venvelope,n marker. At 808, horizontal phases of the receiver's output may be swept. The horizontal phases may be swept by, for example, ODI 110 or ODI 212 and be controlled by digital adaptation block 118 or digital adaptation block 214.

At 810, it may be determined whether the bit error of the sweep of 808 is equal to a first value (e.g., 1). The determination of 810 may be made by examining the output of a bit error checker (e.g., comparator) whose input is data from the sweep at 808. If, at 810, it is determined that the bit error is equal to the first value (e.g., 1), process 800 arrives at conclusion 812, where it is determined that the signal is under-equalized, and process 800 ends at 816. A conclusion that the signal is under-equalized may lead to the AC gain of the receiver being increased in order to increase the vertical height of the eye opening. In embodiments where process 800 is used during the determination of element 614 of process 600, the conclusion that the signal is under-equalized may cause process 600 to proceed to 624 from 614.

If, at 810, it is determined that the bit error is not equal to the first value (e.g., not equal to 1), process 800 arrives at conclusion 814, where it is determined that the signal is over-equalized, and process 800 ends at 816. A conclusion that the signal is over-equalized may lead to the AC gain of the receiver being decreased in order to decrease the overshooting and undershooting of the envelope. In embodiments where process 800 is used during the determination of element 614 of process 600, the conclusion that the signal is over-equalized may cause process 600 to proceed to 616 from 614.

In some embodiments, it may be determined whether the bit error of the sweep of 808 of process 800 is equal to a second value (e.g., 0) instead of the first value (e.g., 1). In such embodiments, element 804 of process 800 may be replaced by setting the Vrefp marker at a voltage above the Venvelope,p marker, and element 806 may be replaced by setting the Vrefn marker at a voltage below the Venvelope,n marker. If the bit error is equal to the second value (e.g., 0), process 800 may arrive at conclusion 814 that the signal is over-equalized. If the bit error is not equal to the second value (e.g., not equal to 0), process 800 may arrive at conclusion 812 that the signal is under-equalized.

It should be understood that one or more elements shown in processes 500, 600, 700, or 800 may be combined with other elements, performed in any suitable order, performed in parallel (e.g., simultaneously or substantially simultaneously), or removed. For example, elements 704 and 706 of process 700 may be performed simultaneously, or in a different order than shown in FIG. 7. Processes 500, 600, 700, and 800 may be implemented using any suitable combination of hardware and/or software in any suitable fashion.

Figure 9:
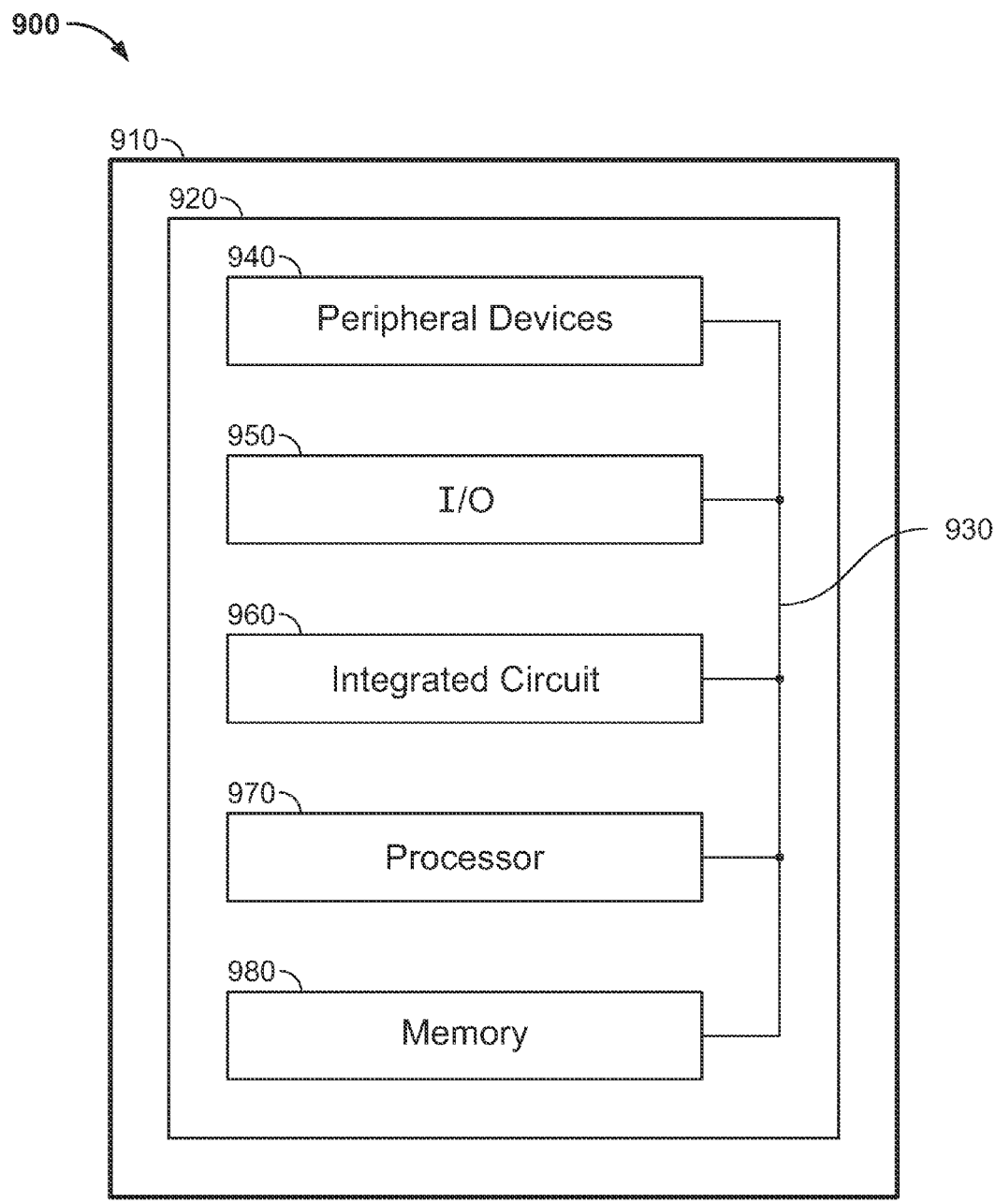
FIG. 9 shows an illustrative system that may be used to implement some embodiments of the present disclosure.

FIG. 9 shows an illustrative system 900 that may be used to implement some embodiments of the present disclosure. For example, system 900 may be used to implement processes 500, 600, 700, or 800 discussed above with respect to FIGS. 5-8. System 900 may be or may include a circuit or other device (e.g., processing block, integrated circuit, application specific standard product (ASSP), application specific integrated circuit (ASIC), programmable logic device (PLD), full-custom chip, dedicated chip). System 900 can include one or more of the following components: a processor 970, memory 980, I/O circuitry 950, circuit 960, and peripheral devices 940. The components of system 900 are connected together by a system bus or other interconnections 930 and are populated on a circuit board 920 which is contained in an end-user system 910.

Circuit 960 may be an integrated circuit, ASSP, ASIC, PLD, or any other suitable circuit. Circuit 960 may contain one or more blocks of processing circuitry, such as core circuitry of a PLD. In some embodiments, circuit 960 may be used to implement one or more elements of communications systems 100 and/or 200. In some embodiments, circuit 960 may include circuitry, such as processing circuitry or core circuitry, that performs process 500, 600, 700, and/or 800.

System 900 may be used in a wide variety of applications, such as computer networking, data networking, instrumentation, video processing, digital signal processing, or any other application where the advantage of using programmable or reprogrammable logic is desirable. Circuit 960 may be used to perform a variety of different logic functions and/or calculate a variety of different mathematical functions. For example, circuit 960 may be configured as a controller or group of processing blocks that work in cooperation with processor 970. Circuit 960 may also be used to perform signal processing. In yet another example, circuit 960 may be configured as an interface between processor 970 and one of the other components in system 900. It should be noted that system 900 is only exemplary, and that the true scope and spirit of the embodiments should be indicated by the following claims.

The foregoing is merely illustrative of the principles of the embodiments and various modifications can be made by those skilled in the art without departing from the scope and spirit of the embodiments disclosed herein. The above described embodiments of the present disclosure are presented for purposes of illustration and not of limitation, and the present invention is limited only by the claims which follow.

What is claimed is:

1. A method for adjusting an alternating current (AC) gain and a direct current (DC) gain of a receiver that receives an input signal and outputs an output signal, the method comprising:
   identifying an eye opening size of the output signal;
   comparing the eye opening size of the output signal to a defined eye opening dimension;
   when the eye opening size is smaller than the defined eye opening dimension by at least a first threshold, increasing the AC gain of the receiver;
   when the eye opening size is substantially larger than a predetermined eye opening dimension by at least a second threshold, decreasing the AC gain of the receiver;
   when the AC gain is at a maximum setting, decreasing the DC gain and resetting the AC gain; and
   when the AC gain is at a minimum setting, increasing the DC gain and resetting the AC gain;
   wherein the increasing the AC gain, decreasing the AC gain, resetting the AC gain, increasing the DC gain, or decreasing the DC gain comprises sending one or more bias signals to the receiver.

2. The method of claim 1, wherein the receiver comprises multiple amplifier stages, and increasing the AC gain, decreasing the AC gain, resetting the AC gain, increasing the DC gain, or decreasing the DC gain comprises adjusting a gain of each amplifier stage of the receiver.

3. The method of claim 2, wherein the multiple amplifier stages comprise 3 amplifier stages.

4. The method of claim 1, wherein the eye opening size of the output signal comprises a vertical height of the eye opening.

5. The method of claim 1, wherein the defined eye opening dimension comprises an optimal vertical eye opening.

6. The method of claim 1, wherein the method comprises identifying a signal envelope of the output signal, and wherein the defined eye opening dimension corresponds to a height of the signal envelope.

7. The method of claim 1, wherein resetting the AC gain of the receiver comprises setting the AC gain to substantially zero.

8. A communication system comprising:
   an adjustable gain receiver;
   an on-die instrument that:

receives an output signal from the adjustable gain receiver; and identifies an eye opening size of the output signal; and digital adaptation circuitry that:

compares the eye opening size of the output signal to a defined eye opening dimension;

increases an alternating current (AC) gain of the receiver when the eye opening size is smaller than the defined eye opening dimension by at least a first threshold;

decreases the AC gain of the receiver when the eye opening size is substantially larger than a predetermined eye opening dimension by at least a second threshold;

decreases a direct current (DC) gain of the receiver and resets the AC gain when the AC gain is at a maximum setting; and increases the DC gain of the receiver and rests and resets the AC gain when the AC gain is at a minimum setting.

9. The communication system of claim 8, wherein increasing the AC gain, decreasing the AC gain, resetting the AC gain, increasing the DC gain, or decreasing the DC gain comprises sending one or more bias signals from the digital adaptation circuitry to the receiver.

10. The communication system of claim 8, wherein the receiver comprises multiple amplifier stages, and wherein increasing the AC gain, decreasing the AC gain, resetting the AC gain, increasing the DC gain, or decreasing the DC gain comprises adjusting a gain of each amplifier stage of the receiver.

11. The communication system of claim 10, wherein the multiple amplifier stages comprise 3 amplifier stages.

12. The communication system of claim 8, wherein the defined eye opening dimension comprises an optimal vertical eye opening.

13. The communication system of claim 8, wherein the defined eye opening dimension comprises an optimal horizontal eye opening.

14. The communication system of claim 8, wherein the on-die instrument identifies a signal envelope of the output signal, and wherein the defined eye opening dimension corresponds to a height of the signal envelope.

15. The communication system of claim 8, wherein resetting the AC gain of the receiver comprises setting the AC gain to zero.

16. An electrical device comprising a communication circuitry that comprises:

a receiver that receives an input signal and outputs an output signal;

envelope detection circuitry that:

receives the output signal of the receiver;

identifies an eye opening size of the output signal; and compares the eye opening size of the output signal to a defined eye opening dimension;

adaptation circuitry that:

increases an alternating current (AC) gain of the receiver when the eye opening size is smaller than the defined eye opening dimension by at least a first threshold;

decreases the AC gain of the receiver when the eye opening size is substantially larger than a predetermined eye opening dimension by at least a second threshold;

decreases a direct current (DC) gain of the receiver and resets the AC gain when the AC gain is at a maximum setting; and increases the DC gain of the receiver and resets the AC gain when the AC gain is at a minimum setting.

17. The electrical device of claim 16, wherein the communication circuitry comprises an on-die instrument that comprises the envelope detection circuitry.

18. The electrical device of claim 17, wherein the on-die instrument determines an equalization state of the output signal based on the comparison between the eye opening size and the defined eye opening size, wherein the equalization state is under-equalized, over-equalized, or adequately equalized.

19. The electrical device of claim 18, wherein increasing the AC gain, decreasing the AC gain, resetting the AC gain, increasing the DC gain, or decreasing the DC gain comprises sending one or more bias signals from a digital adaptation circuitry to the receiver based on the equalization state of the output signal.

20. The electrical device of claim 16, wherein the input signal comprises a serial digital data signal.

\* \* \* \* \*